United States Patent
Tai et al.

[19]

[11] Patent Number: 6,045,619
[45] Date of Patent: Apr. 4, 2000

[54] HORIZONTAL-TYPE SILICON-NITRIDE FURNACE

[75] Inventors: Wen-Kuang Tai, Hsinchu; Kuo-Tung Chu, Taipei; Kuo-Liang Huang, Hsinchu, all of Taiwan

[73] Assignee: United Microelectronics Corp., Hsinchu, Taiwan

[21] Appl. No.: 09/212,006

[22] Filed: Dec. 15, 1998

[51] Int. Cl.$^7$ .................................................. C23C 16/00
[52] U.S. Cl. ........................... 118/724; 118/715; 432/93; 432/200; 432/205
[58] Field of Search ................................ 432/65, 93, 194, 432/200, 205, 253; 118/715, 719, 724, 725

[56] References Cited

U.S. PATENT DOCUMENTS 4,615,909 10/1986 Thijssen et al. ........................... 427/82
4,992,044 2/1991 Philipossian ............................ 432/253

*Primary Examiner*—Richard Bueker
*Assistant Examiner*—Liza Pacheco
*Attorney, Agent, or Firm*—Thomas, Kayden, Horstemeyer & Risley

[57] ABSTRACT

A horizontal-type silicon-nitride furnace (HOSINF) having two tubes is provided. The HOSINF includes an outer tube and an inner tube. One end of the outer tube is coupled to a pump. The other end of the outer tube can be well sealed by a door through a flange. The inner tube is located inside the outer tube. The inner tube has a closed end and an opened end, in which the opened end is near to the door, and the closed end is near to the pump. The inner tube includes a first gas inlet and a second gas inlet. Desired reaction gases are flushed into the inner tube from the first inlet and the second inlet. The inner tube surrounds a paddle carrying several wafers, on which a silicon nitride layer is to be formed. The paddle is mounted on the door. A heater is located on a side periphery of the outer tube.

9 Claims, 2 Drawing Sheets

HORIZONTAL-TYPE SILICON-NITRIDE FURNACE

BACKGROUND OF THE INVENTION

1. Field of the Invention

This invention relates to an equipment used in semiconductor fabrication, and more particularly to a horizontal-type silicon-nitride furnace (HOSINF) used in a deposition process of silicon nitride so as to prevent undesired particles from forming on the fabricating device.

2. Description of Related Art

In current semiconductor fabrication, heat is a necessary factor in several fabrication processes, such as thermal diffusion, thermal oxidation, or material deposition. In the thermal diffusion process, a thermal diffusion furnace is necessarily used to provide a desired thermal environment. The thermal diffusion furnace basically includes horizontal-type furnace and vertical-type furnace. The horizontal-type furnace is more widely used.

In the thermal oxidation process, a thermal oxidation furnace similar to the one used in the thermal diffusion process is also used. The thermal oxidation furnace also includes a horizontal-type design and a vertical-type design. The above two thermal furnaces are basically operated at a pressure close to one atmospheric pressure (atm). There are also several other kinds of furnace used in a different operating condition, such as a high pressure environment having pressure greater a few atms, or used in a different fabrication process, such as plasma process. Generally, all kinds of furnace have horizontal type and vertical type.

In semiconductor fabrication, silicon nitride is a material widely included in the device. A silicon nitride layer usually is formed by a deposition process, such as a chemical vapor deposition (CVD). The deposition process is also performed in a thermal furnace, called silicon-nitride furnace (SINF), which is also designed in a horizontal-type SINF (HOSINF) or a vertical-type SINF (VESINF).

FIG. 1 is a cross-sectional view, schematically illustrating a conventional HOSINF used in a silicon nitride deposition process. In FIG. 1, a HOSINF 10 includes a large outer tube 12, which has one end coupled to a pump. The other end of the outer tube 12 has a door 14, which can well seal the outer tube 12. A flange 16 is put between the door 14 and the outer tube 12 so that the outer tube 12 can be well sealed by the door 14.

When a silicon nitride deposition process is performed, several wafer boats 18, each carrying several annealed wafers 20, are horizontally transported into the outer tube 12 of the HOSINF 10. The wafer boats 18 include quartz. The wafer boats 18 rides on a paddle 22, or called a loading plate 22, which can be mounted on the door 14. The silicon nitride deposition process needs reaction gasses of $SiH_2Cl_2$ and $NH_3$, which are flushed in respectively from gas inlets 15 and 17 at different locations of the flange 16. The reaction products include not only silicon nitride but also a byproduct of $NH_4Cl$. The outer tube 12 is heated by a heater 24 to have uniform temperature distribution at 780° C. above the heater 24, where the deposited silicon nitride is denser. The other location of the outer tube 12, such as a region 26, has lower temperature, where the deposited silicon nitride layer is looser and is easily exfoliated. Moreover, if the temperature goes down to 150° C., $NH_4Cl$ may turn into a solid film layer with less density at locations 28, 30. This means that the $NH_4Cl$ film layer is formed about at the conjunction area of the pump, and about at the flange 16.

In this conventional design of the HOSINF 10, since the gas inlets 15, 17 are located in the flange 16, when gases of $SiH_2Cl_2$ and $NH_3$ are flushed into the outer tube 12, the deposited $NH_4Cl$ film layer and the loose silicon nitride may be blown in also to form a particle dust. Moreover, when a purging process to purge vacuum is performed, a backstream may be induced by an improper purging process. This causes the deposited material powder at the region 28 to be transported back to the NOSINF 10 on the wafers 20. Both of above two situations, the wafers 20 may be dusted by particles, causing the yield rate to be reduced.

SUMMARY OF THE INVENTION

It is therefore an objective of the present invention to provide an improved horizontal-type silicon-nitride furnace (HOSINF) having two tubes so as to prevent particle dust from occurring during flushing reaction gasses in. The yield rate therefore is not decreased.

It is another an objective of the present invention to provide a an improved horizontal-type silicon-nitride furnace (HOSINF) having two tubes so as to prevent dust particles from flowing back during a purging vacuum process. The yield rate therefore is not decreased.

In accordance with the foregoing and other objectives of the present invention, an improved HOSINF having two tubes is provided. The HOSINF includes an outer tube and an inner tube. One end of the outer tube is coupled to a pump. The other end of the outer tube can be well sealed by a door through a flange. The inner tube is located inside the outer tube. The inner tube has a closed end and an opened end, in which the opened end is near to the door, and the closed end is near to the pump. The inner tube includes a first gas inlet and a second gas inlet.

In the foregoing, the improved HOSINF includes an outer tube and an inner tube located inside the outer tube. Desired reaction gases are flushed into the inner tube from the first inlet and the second inlet. The inner tube surrounds a paddle carrying several wafers, on which a silicon nitride layer is to be formed. The paddle is mounted on the door. A heater is located on a side periphery of the outer tube. In this structure, when the reaction gases are flushed in during depositing silicon nitride, a particle dust are avoided. Moreover, when a purging vacuum process is performed on the improved HOSINF, dust particles are prevented from being blown in onto the wafers again if the purging vacuum process is improperly performed.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

In the invention, an inner tube is introduced to be located inside an outer tube. Desire gases are flushed into the inner tube to deposit silicon nitride onto wafers so as to prevent undesired dust particles from being formed on the wafers. The yield rate is not degraded.

Figure 2:
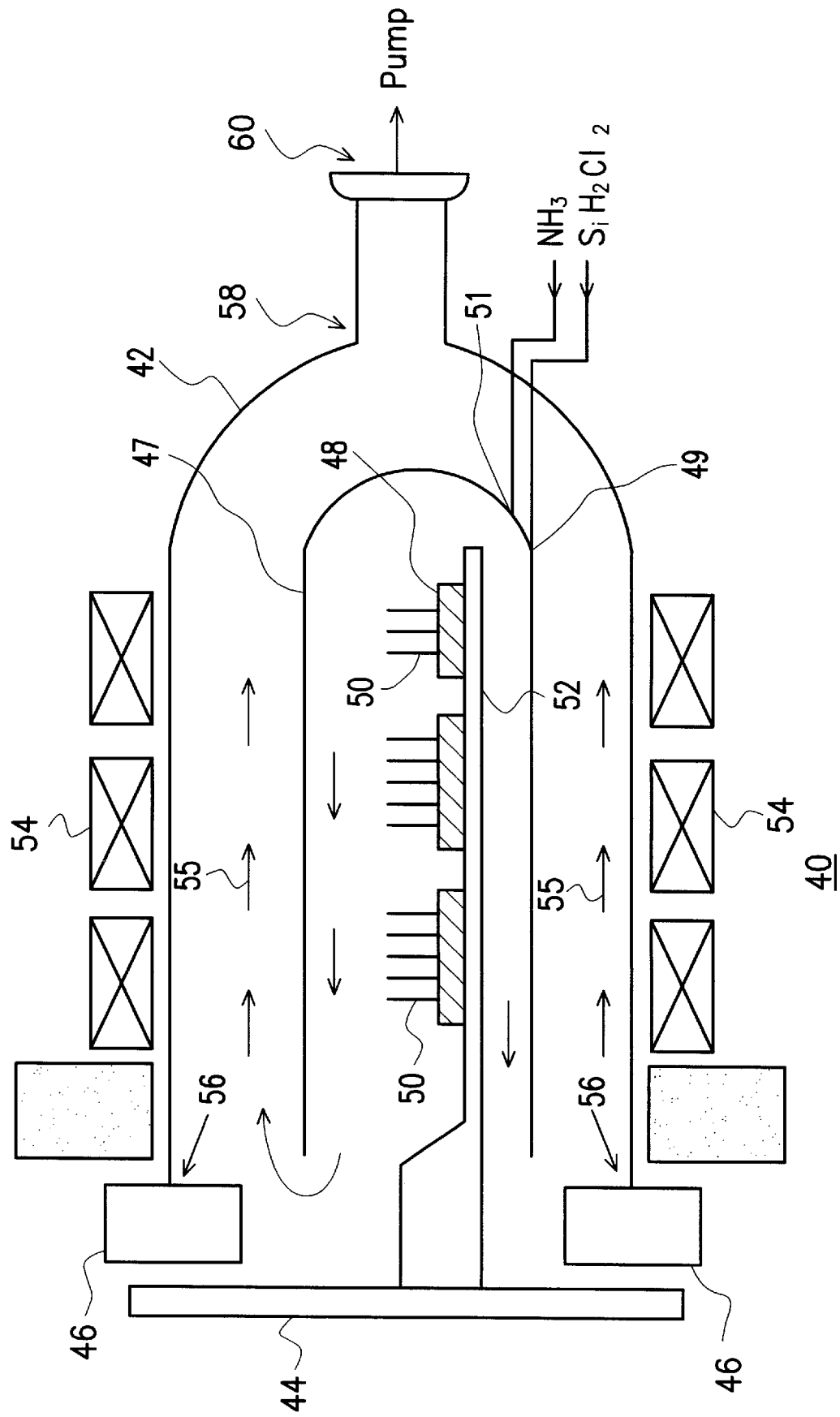
FIG. 2 is a cross-sectional view, schematically illustrating a HOSINF used in a silicon nitride deposition process, according to a preferred embodiment of the invention.

FIG. 2 a cross-sectional view, schematically illustrating a HOSINF used in a silicon nitride deposition process, according to a preferred embodiment of the invention. In FIG. 2, a HOSINF 40 includes an outer tube 42 and an inner tube 47 located inside the outer tube 42. The outer tube 42 has one end being coupled to a pump. The other end of the outer tube 42 is opened and can he tightly sealed by a door 44 through a flange 46 in between. The inner tube 47 has an opened end and a closed end, in which the opened end is near to the door 44 and the closed end is near to the pump. The inner tube 47 and the outer tub 42 are, for example, assembled in a coaxial structure. The inner tube 47 includes, for example, two gas inlets 51, 49 near the closed end, so as to allots desired reaction gases to be flushed in from outside of the HOSINF 40. The reaction gases used for the deposition of silicon nitride are $NH_3$ and $SiH_2Cl_2$.

When a silicon nitride deposition process is performed, several wafer boats 48, each carrying several wafers 50, are horizontally transported into the inner tube 47 of the HOSINF 40. The wafer boats 48 include quartz. The wafer boats 48 rides on a paddle 52, or called a loading plate 52, which can be, for example, mounted on the door 44.

Figure 1:
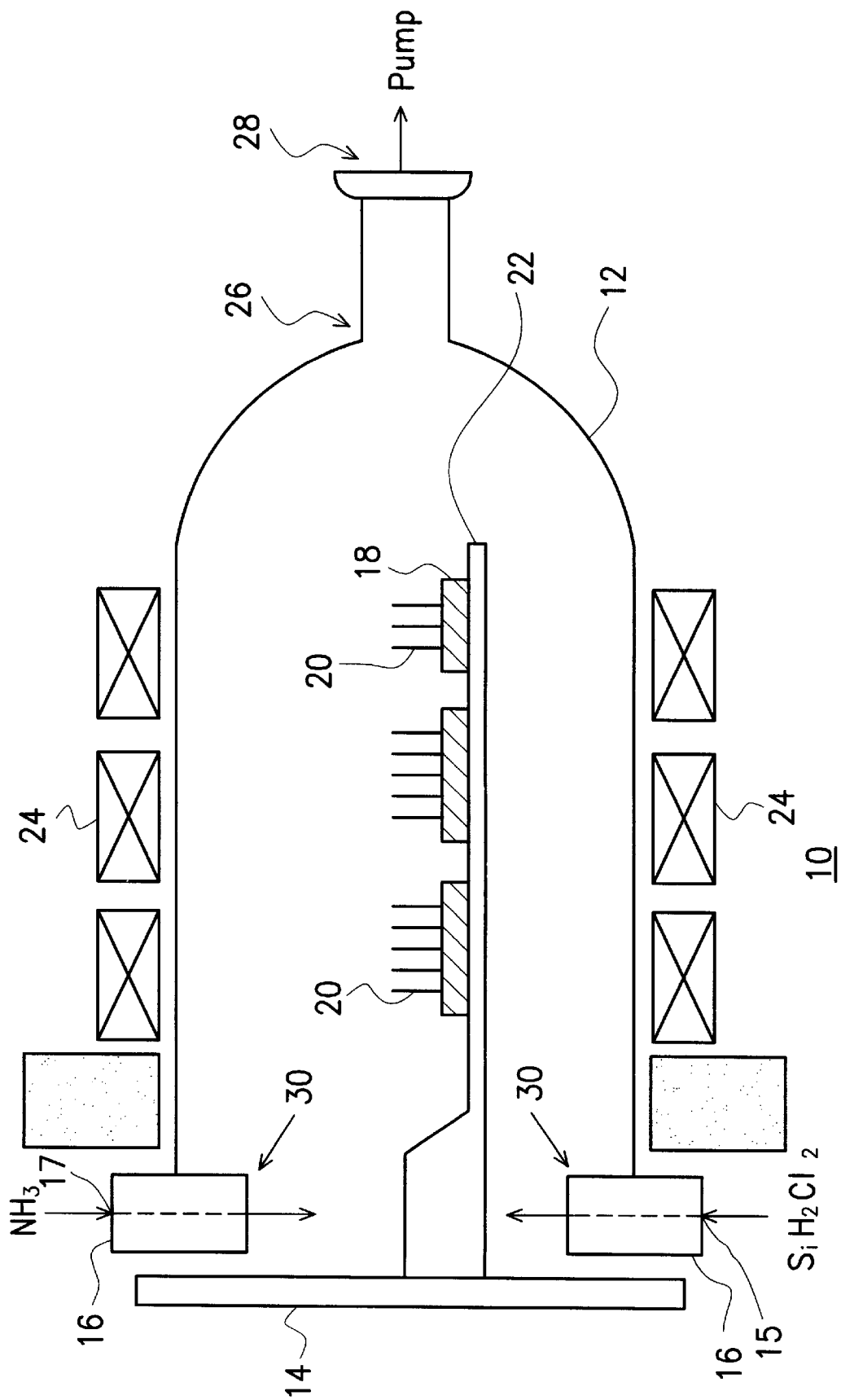
FIG. 1 is a cross-sectional view, schematically illustrating a conventional HOSINF used in a silicon nitride deposition process.

The silicon nitride deposition process needs reaction gases of, for example, $SiH_2Cl_2$ and $NH_3$, which are flushed in respectively from gas inlets 41 and 51. The outer tube 42 is heated by a heater 54 surrounding a side periphery region of the outer tube 42 in order to have uniform temperature distribution on the wafers 50. A few low temperature regions 56, 58, 60 usually occurs. After reaction, the reaction products include not only silicon nitride but also a byproduct of $NH_4Cl$. The $NH_4Cl$ may turn into solid dust particles when temperature is too low. Moreover, the density of the silicon nitride layer is also much less than a usual density at high temperature. This causes some issues in the conventional HOSINF show in FIG. 1.

In the invention, since the gas inlets 49, 51 are located within a high temperature region, there is no loose silicon nitride occurring at the gas inlets 49, 51. A silicon nitride particle dust is avoided during depositing process. Moreover, the dust particles of $NH_4Cl$ may be formed at the low temperature regions 56, 58, 60 but the dust particles of $NH_4Cl$ do not be blown onto the wafers 50 due to a circulation route 55 induced by the inner tube 47. Actually, the dust particles of $NH_4Cl$ flow to the pump. Therefore the dust particles of silicon nitride and $NH_4Cl$ do not affect the silicon nitride deposition quality of the wafers 50.

Moreover, when a purging vacuum process is performed, if an improper operation occurs, a backstream may occur. Even though the backstream may cause the dust particles deposited at the low temperature regions 58, 60 to be blown back to the HOSINF 40, the dust particles are shielded by the inner tube 47. Therefore, the wafers 50 are also not affected by the dust particles. The yield rate is effectively maintained without a degration.

In conclusion, the HOSINF of the invention includes an addition inner tube 47 and a modification of the gas inlets 49, 51 to create a circulation route 55 so that the dust particles do not affect the wafers 50 during either depositing silicon nitride or purging vacuum.

The invention has been described using an exemplary preferred embodiment. However, it is to be understood that the scope of the invention is not limited to the disclosed embodiment. On the contrary it is intended to cover various modifications and similar arrangements. The scope of the claims, therefore, should be accorded the broadest interpretation so as to encompass all such modifications and similar arrangements.

What is claimed is:

1. A horizontal-type silicon-nitride furnace (HOSINF) comprising:

an outer tube, which comprises a first end coupled to a pump, and a second opened end that can be sealed by a door; and an inner tube, which located inside the outer tube comprises a closed end near the pump, an opened end near the door, and at least two gas inlets near the closed end, wherein the gas inlets allows desired gases to be flushed into the inner tube from outside of the HOSINF.

2. The HOSINF of claim 1, wherein the HOSINF further comprises a flange between the door and the second opened end of the outer tube to serving, as a sealing part so as to allow the second opened end to be well sealed by the door.

3. The HOSINF of claim 1, wherein the first gas inlet allows $SiH_2Cl_2$ to be flushed in.

4. The HOSINF of claim 1, wherein the first gas inlet allows $NH_3$ to be flushed in.

5. The HOSINF of claim 1, wherein the door holds a paddle, which can be located inside the inner tube.

6. The HOSINF of claim 5, wherein the paddle holds a plurality of wafer boats.

7. The HOSINF of claim 6, wherein each of the wafer boats holds a plurality of wafers.

8. The HOSINF of claim 1, wherein the door comprises a loading plat to hold a plurality of wafer in the inner tube.

9. The HOSINF of claim 1, wherein the HOSINF comprises a heater surrounding a side periphery of the outer tube.

* * * * *